(12) United States Patent
Bolken

(10) Patent No.: US 6,963,142 B2
(45) Date of Patent: Nov. 8, 2005

(54) FLIP CHIP INTEGRATED PACKAGE MOUNT SUPPORT

(75) Inventor: Todd O. Bolken, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 275 days.

(21) Appl. No.: 09/983,983

(22) Filed: Oct. 26, 2001

(65) Prior Publication Data

US 2003/0080441 A1 May 1, 2003

(51) Int. Cl.⁷ .......................................... H01L 23/544
(52) U.S. Cl. .................. 257/797; 257/787; 257/778; 257/774; 257/773; 257/788; 257/686
(58) Field of Search .................. 257/678, 685, 257/686, 734, 737, 738, 773, 774, 778, 777, 787; 438/108, 112, 117, 118, 119

(56) References Cited

U.S. PATENT DOCUMENTS

| | | | |
|---|---|---|---|
| 5,311,059 A | * | 5/1994 | Banerji et al. ............... 257/659 |
| 5,615,089 A | * | 3/1997 | Yoneda et al. ............... 257/723 |
| 5,981,312 A | * | 11/1999 | Farquhar et al. ............. 438/112 |
| 6,038,136 A | * | 3/2000 | Weber ......................... 174/260 |
| 6,064,114 A | * | 5/2000 | Higgins, III ................. 257/698 |
| 6,075,710 A | * | 6/2000 | Lau ............................. 174/255 |
| 6,143,581 A | | 11/2000 | Johnson et al. |
| 6,210,992 B1 | | 4/2001 | Tandy et al. |
| 6,229,215 B1 | * | 5/2001 | Egawa ......................... 257/686 |
| 6,248,959 B1 | * | 6/2001 | Sylvester ..................... 174/256 |
| 6,294,825 B1 | | 9/2001 | Bolken et al. |
| 6,324,069 B1 | * | 11/2001 | Weber ......................... 174/260 |
| 6,329,220 B1 | | 12/2001 | Bolken et al. |
| 6,331,453 B1 | * | 12/2001 | Bolken et al. ............... 438/106 |
| 6,365,434 B1 | | 4/2002 | Rumsey et al. |
| 6,395,579 B2 | | 5/2002 | Tandy et al. |
| 6,400,574 B1 | | 6/2002 | Stephenson et al. |
| 6,417,018 B1 | | 7/2002 | Bolken et al. |
| 6,444,501 B1 | | 9/2002 | Bolken |
| 6,462,273 B1 | | 10/2002 | Corisis et al. |
| 6,503,781 B2 | | 1/2003 | Stephenson et al. |
| 6,518,654 B1 | | 2/2003 | Bolken et al. |
| 6,521,980 B1 | | 2/2003 | Tandy et al. |
| 6,531,763 B1 | | 3/2003 | Bolken et al. |
| 6,537,853 B1 | | 3/2003 | Johnson et al. |
| 6,559,537 B1 | | 5/2003 | Bolken et al. |
| 6,573,592 B2 | | 6/2003 | Bolken |
| 6,576,496 B1 | | 6/2003 | Bolken et al. |
| 6,589,820 B1 | | 7/2003 | Bolken |
| 6,605,331 B1 | | 8/2003 | Johnson et al. |
| 6,638,595 B2 | | 10/2003 | Rumsey et al. |
| 6,644,949 B2 | | 11/2003 | Rumsey et al. |

*Primary Examiner*—Nathan J. Flynn
*Assistant Examiner*—Pershelle Greene
(74) *Attorney, Agent, or Firm*—Dickstein Shapiro Morin & Oshinsky LLP

(57) ABSTRACT

A flip chip integrated package is described as including a chip encapsulated with a mold compound and mounted on a substrate. In one embodiment, the mold compound surrounds the chip, filling in space between the chip and the substrate. The substrate includes a plurality of openings through which the mold compound extrudes, forming molded buttons. In another embodiment, the substrate includes more numerous openings of a smaller diameter, which allow the mold compound to extrude through and create a molded rib. The molded buttons and the molded rib serve as a mount support feature. The substrate includes vents to allow trapped gas to be expelled from the package.

17 Claims, 5 Drawing Sheets

U.S. PATENT DOCUMENTS

| | | |
|---|---|---|
| 6,653,173 B2 | 11/2003 | Bolken |
| 6,660,558 B1 | 12/2003 | Bolken et al. |
| 6,664,139 B2 | 12/2003 | Bolken |
| 6,677,675 B2 | 1/2004 | Bolken |
| 6,683,388 B2 | 1/2004 | Bolken |
| 2001/0008780 A1 | 7/2001 | Tandy et al. |
| 2001/0045637 A1 * | 11/2001 | Farquhar et al. ............ 257/687 |
| 2001/0046724 A1 | 11/2001 | Stephenson et al. |
| 2002/0000675 A1 | 1/2002 | Rumsey et al. |
| 2002/0001883 A1 | 1/2002 | Rumsey et al. |
| 2002/0016023 A1 | 2/2002 | Bolken |
| 2002/0048843 A1 | 4/2002 | Bolken |
| 2002/0050654 A1 | 5/2002 | Bolken |
| 2002/0052063 A1 | 5/2002 | Bolken |
| 2002/0096789 A1 | 7/2002 | Bolken |
| 2002/0100976 A1 * | 8/2002 | Hui et al. .................... 257/738 |
| 2002/0105092 A1 * | 8/2002 | Coyle ......................... 257/778 |
| 2002/0131251 A1 | 9/2002 | Corisis et al. |
| 2002/0186549 A1 | 12/2002 | Bolken |
| 2003/0038381 A1 | 2/2003 | Bolken |

* cited by examiner

FLIP CHIP INTEGRATED PACKAGE MOUNT SUPPORT

FIELD OF THE INVENTION

The invention generally relates to the packaging of semiconductors, and more particularly to a flip chip integrated package with a surface mount support.

BACKGROUND

Known flip chip integrated packages ("FCIP") include a chip mounted on a substrate within a mold compound. Specifically, with reference to FIGS. 1–2, a FCIP 10 is illustrated as including a chip 14 mounted on a substrate 12. The chip 14 includes conductive solder bumps 16 that contact a first surface 11 of the substrate 12. An underfill material 20 fills in the space around the under bumps 16 and between the substrate 12 and the chip 14. Solder balls 18 are positioned on a second surface 13 of the substrate 12 opposite from the first surface 11.

A mold compound 22 surrounds the chip 14 and adheres to the first surface 11 of the substrate 12 to provide physical and environmental protection to the chip 14. The composition of the mold compound 22 may be one of several compounds that are well known in the industry.

The mold compound 22 is normally applied to the package in a liquid or semi-liquid state of heightened temperature. As the mold compound 22 cools, gas expels from the mold compound and may become trapped within the package. Gas trapped in a semiconductor package causes numerous problems, chief among them being that the gas may eventually expand and cause the package to separate apart during either heat up and cool down during testing or during operation.

The underfill material 20 is utilized along with through-hole venting to assist in expelling any gas from the package to prevent gas from becoming trapped therein. Alternatively, sometimes a vacuum is used to pull gas from the mold compound 22. The use of underfill material 20 increases the tooling costs in the fabrication of flip chip integrated packages. Further, the use of vacuum increases the process costs in the fabrication of FCIPs.

There is therefore a need for a flip chip integrated package that eliminates the need for both underfill material and the use of a vacuum.

SUMMARY

The invention provides a flip chip integrated package that includes a substrate having a first and a second surface and a plurality of openings extending from the first to the second surfaces, a chip mounted on the first surface of the substrate over the openings, and a mold compound encapsulating the chip and adhering to the first surface of the substrate. The mold compound fills in space between the chip and the first surface of the substrate and extends through the openings to create molded buttons.

The invention further provides a flip chip integrated package including a substrate having a first and a second surface and a plurality of openings extending from the first to the second surfaces, a chip mounted on the first surface of the substrate over the openings, and a mold compound encapsulating the chip and adhering to the first surface of the substrate. The mold compound fills in space between the chip and the first surface of the substrate and extends through the openings to create a molded rib.

The invention also provides a method of forming a flip chip integrated package. The method includes the steps of mounting a chip on a substrate, the substrate having a first and a second surface, a plurality of openings located along a midline of the substrate and extending from the first to the second surfaces, and one or more vents, encapsulating the chip with a mold compound, wherein the mold compound fills in a space between the chip and the substrate and extrudes through the openings and extends from the second surface, and venting any trapped gases from the package.

These and other advantages and features of the invention will be more readily understood from the following detailed description of the invention that is provided in connection with the accompanying drawings.

DETAILED DESCRIPTION OF PREFERRED EMBODIMENTS

Figure 1:
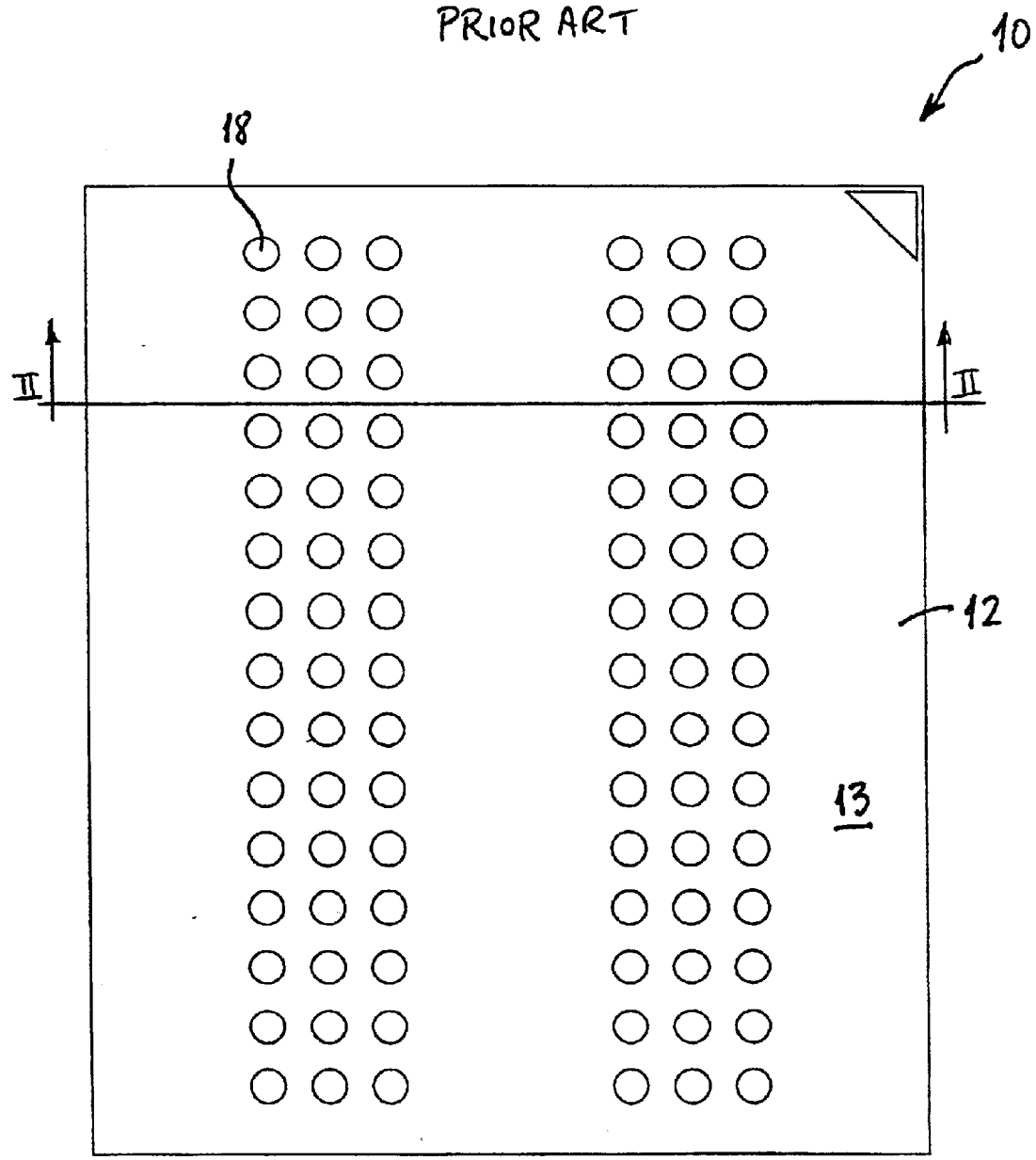
FIG. 1 is a bottom view of a known flip chip integrated package.
Figure 2:
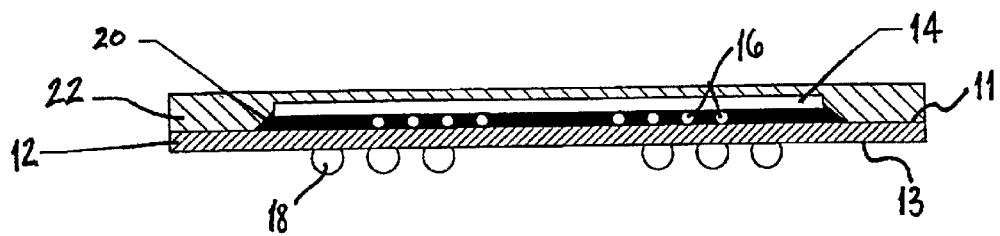
FIG. 2 is a cross-sectional view of the flip chip integrated package taken along line II—II of FIG. 1.
Figure 3:
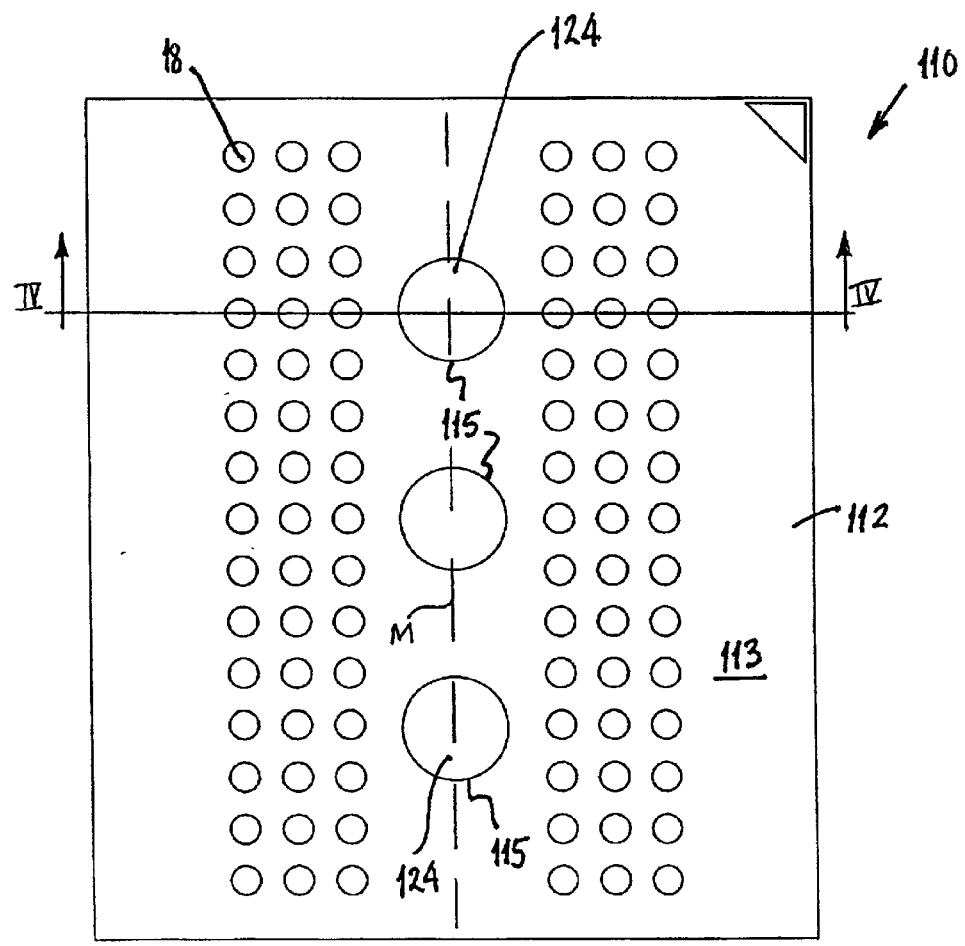
FIG. 3 is a bottom view of a flip chip integrated package constructed in accordance with a first embodiment of the invention.
Figure 4:
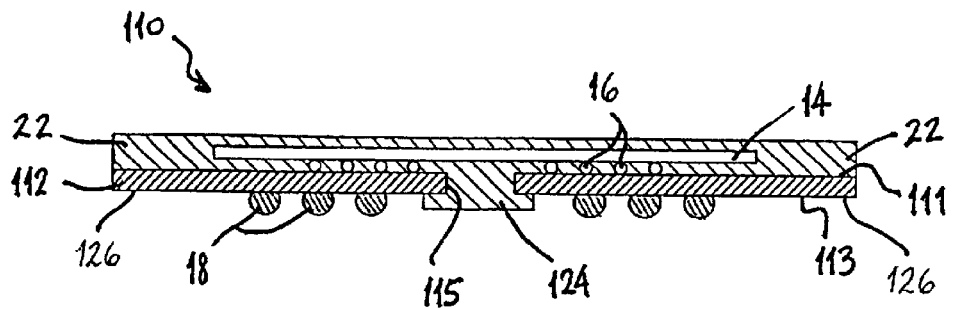
FIG. 4 is a cross-sectional view taken along line IV—IV of FIG. 3.

With particular reference to FIGS. 3–4, in which like numerals denote like elements, there is shown a flip chip integrated package 110 that includes a chip 14 mounted on a substrate 112. The substrate 112 includes a first surface 111 and an opposite second surface 113. A plurality of openings 115 extends through the substrate 112 from the first surface 111 to the second surface 113. As shown in FIG. 3, three exemplary openings 115 are shown as extending through a central portion along a midline M of the substrate 112. The number of openings 115 may be less than or greater than three.

A plurality of conductive solder bumps 16 is positioned on the chip 14 for contact with the first surface 111. The solder bumps 16 are positioned peripheral to the openings 115. A mold compound 22 encapsulates the chip 14 and adheres to the first surface 111 of the substrate 112. The mold compound 22 fills in the space under the chip 14 around the conductive solder bumps 16 and above the first surface 111. Further, the mold compound 22 extends through the openings 115. Upon setting, the mold compound 22 that has extended through the openings 115 is formed into molded buttons 124 which project a distance from the second surface 113. A plurality of solder balls 18 are positioned on the second surface 113 of the substrate 112 peripheral to the openings 115. In an undeformed, pre-reflow state, the solder balls 18 extend a greater distance from the second surface 113 than the molded buttons 124. The molded buttons 124 serve as a support mount for the package 110 to support the package to a controlled height during solder ball reflow. During reflow, the solder balls 18 deform to the height of the molded buttons 124.

Figure 7:
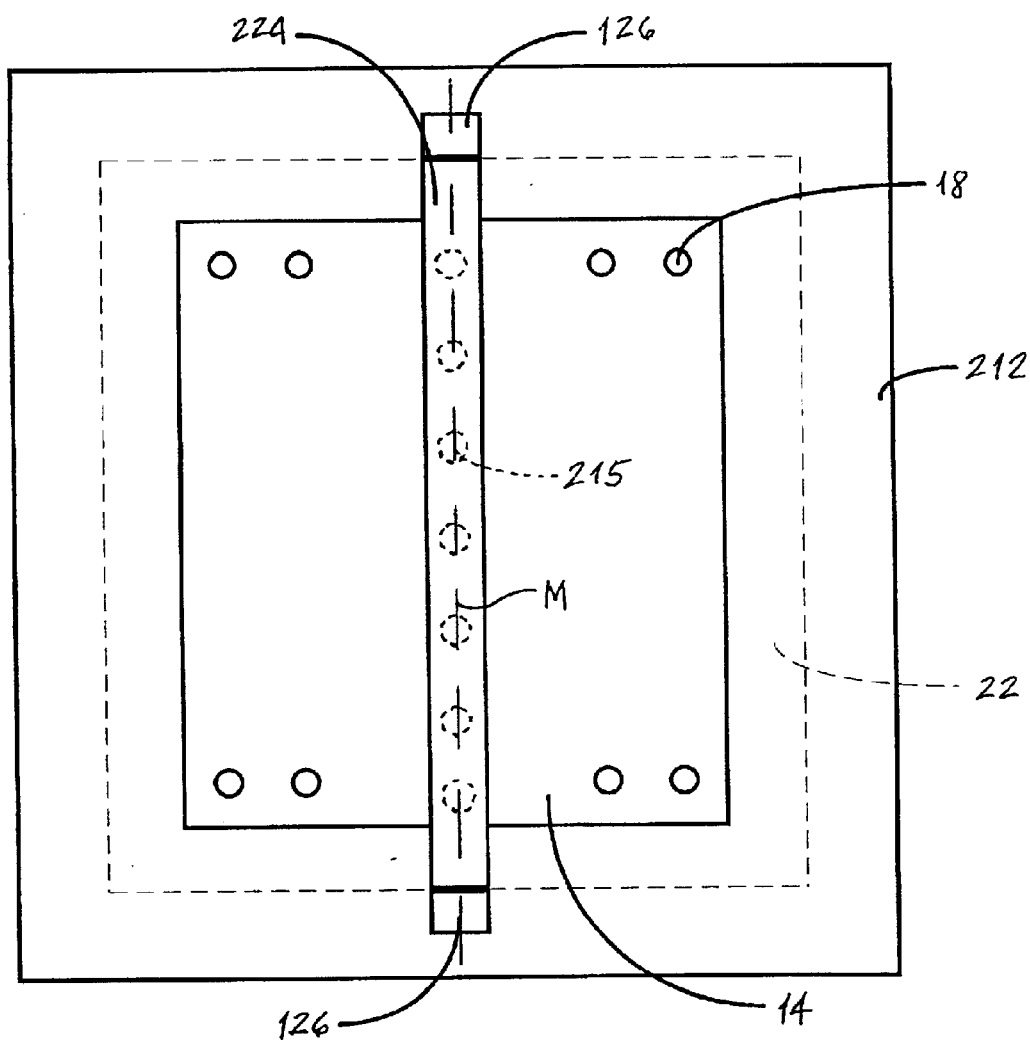
FIG. 7 is a bottom view of the flip chip integrated package of FIG. 5.

The substrate 112 further includes at least one vent 126 positioned exterior to and in line with the openings 115, along the midline M. As shown in FIGS. 4, 7, two vents 126 are positioned on the substrate 112 in alignment with the openings 115. The vents 126, along with the openings 115 and the mold compound assist in allowing trapped gas to escape the package 110.

The presence of the openings 115 serves a dual purpose. The openings 115 serve as conduits for the mold compound 22 in the formation of the mold buttons 124. Further, the openings 115 allow gases to escape from the mold compound 22 during setting, thereby inhibiting the trapping of such gases. In this way, the use of underfill material is not required, and a vacuum is not needed to assist in expelling any gases.

Figure 5:
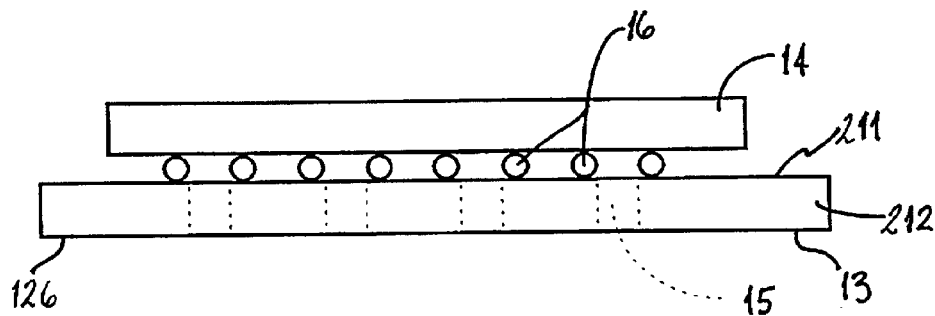
FIG. 5 is a side view of a flip chip integrated package being fabricated in accordance with a second embodiment of the invention.
Figure 6:
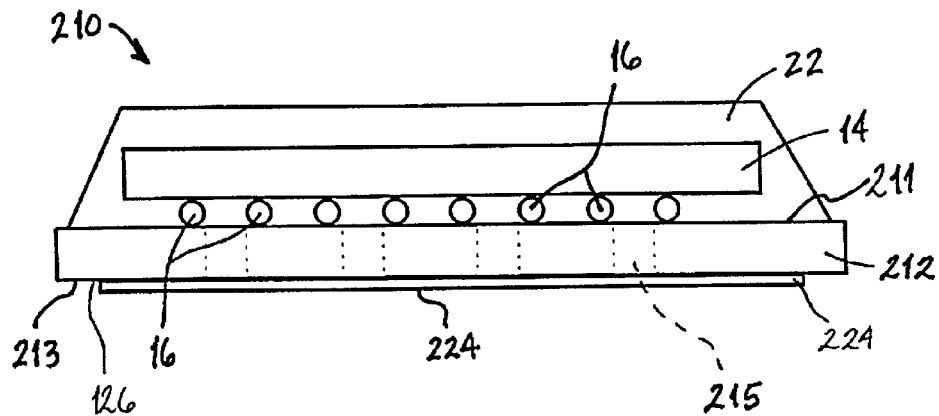
FIG. 6 is another side view of the flip chip integrated package of FIG. 5.

FIGS. 5–7 illustrate another embodiment of a flip chip integrated package 210 constructed in accordance with the invention. FIGS. 5, 6 are views of the package 210 taken from an angle orthogonal to the angle of view of FIG. 4. FIG. 7 is a view of the package 210 taken from beneath the substrate 212. The package 210 differs from the package 110 in that it lacks mold buttons such as the mold buttons 124 (FIG. 3). Instead of the openings 115, the substrate 212 of the flip chip integrated package 210 includes openings 215. The openings 215 are smaller in diameter and more numerous than the openings 115. The greater number of openings 215 allows the mold compound 22 to extrude through and create a molded rib 224. The molded rib 224 acts as a support mount for the package 210 to support the package to a controlled height during solder ball reflow. Alternatively, instead of the openings 215, a centrally disposed slot may be used in the creation of a molded rib.

The substrate 212 further includes at least one vent 126 positioned exterior to and along the midline M with the openings 215. As shown in FIGS. 6, 7, two vents 126 are so positioned. The vents 126, along with the openings 215 and the mold compound assist in allowing trapped gas to escape the package 210.

The solder balls 18 are applied to the second surface 213 of the substrate 212 after setting of the mold compound. In an undeformed, pre-reflow state, the solder balls 18 project from the second surface 213 a greater distance than the molded rib 224. Upon reflow, the solder balls 18 deform to project the same distance from the second surface 213 as the molded rib 224.

Figure 8:
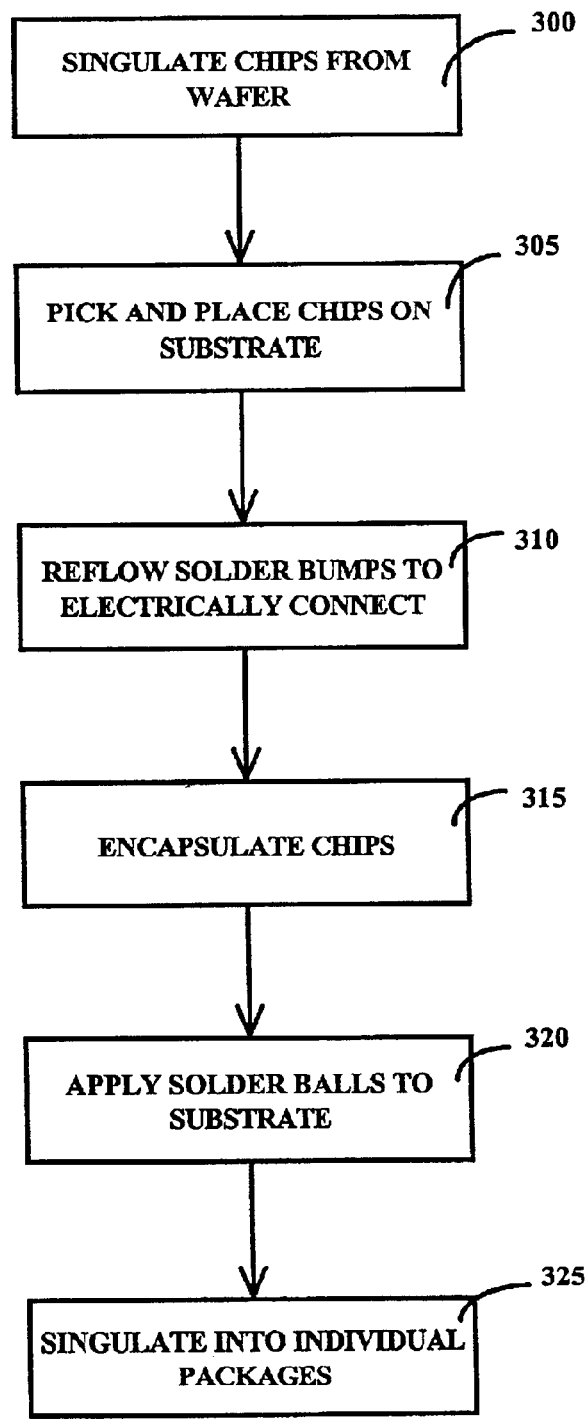
FIG. 8 illustrates a process for assembling a flip chip integrated package in accordance with an embodiment of the invention.

With reference to FIG. 8, next will be described a method for assembling a flip chip integrated package in accordance with an embodiment of the invention. At step 300, dies, or chips, are singulated from a wafer. The chips each include a plurality of solder bumps. Individual chips are then placed on a substrate with a suitable pick and place apparatus at step 305. The substrate may be presented as a strip. The solder bumps on the chips is then reflowed to provide electrical connectivity with the substrate at step 310. The chips are then encapsulated with the mold compound at step 315. Then, at step 320, solder balls are applied to the substrate. Finally, at step 325, the encapsulated packages are singulated from the strip.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, although under bumps 16 are shown, any suitable material may be used to mount the chip 14 on the substrate 112, 212. Accordingly, the invention is not to be seen as limited by the foregoing description, but is only limited by the scope of the appended claims.

What is claimed as new and desired to be protected by Letters Patent of the United States is:

1. A device having a flip chip integrated package and a support structure, comprising:
    a substrate having a first and a second surface and a plurality of openings extending from said first to said second surfaces;
    a chip including a plurality of conductive solder bumps for electrical connectivity with said substrate, said chip mounted on said first surface of said substrate over said openings;
    a plurality of solder balls on said second surface of said substrate; and
    a mold compound encapsulating said chip and adhering to said first surface of said substrate but not extending to side surfaces of said substrate, said chip supported entirely on said substrate by said conductive solder bumps, wherein said mold compound further fills in space between the chip and the first surface of the substrate and extends through said openings to create molded buttons projecting from said second surface of said substrate which act as a support structure, wherein said solder balls in a pre-reflow state project a distance from said second surface of said substrate greater than said molded buttons such that said molded buttons serve to support the package at a controlled height during a solder ball reflow.

2. The package of claim 1, wherein said molded buttons are located along a midline of said substrate between said solder balls.

3. The package of claim 1, further comprising one or more vents positioned on said substrate so as to allow gas to escape from the package.

4. A device having a flip chip integrated package and a support structure, comprising:
    a substrate having a first and a second surface and a plurality of openings extending from said first to said second surfaces;
    a chip including a plurality of conductive solder bumps for electrical connectivity with said substrate, mounted on said first surface of said substrate over said openings;
    a plurality of solder balls on said second surface of said substrate; and
    a mold compound encapsulating said chip and adhering to said first surface of said substrate, said chip supported entirely on said substrate by said conductive solder bumps, wherein said mold compound further fills in space between the chip and the first surface of the substrate and extends through said openings to create a molded rib which acts as a support structure, wherein said solder balls in a pre-reflow state project a distance from said second surface of said substrate greater than said molded rib such that said molded rib serves to support the package at a controlled height during solder ball reflow.

5. The package of claim 4, wherein said molded rib is located along a midline of said substrate between said solder balls.

6. The package of claim 4, further comprising one or more vents positioned on said substrate so as to allow gas to escape from the package.

7. A method of forming a device having a flip chip integrated package and a support structure, comprising:
mounting a chip including a plurality of conductive solder bumps for electrical connectivity with a substrate on said substrate, the substrate having a first and a second surface and a plurality of openings extending from the first to the second surfaces;
encapsulating the chip with a mold compound, wherein said mold compound adheres to said first surface of said substrate but does not extend to side surfaces of said substrate, said chip supported entirely on said substrate by said conductive solder bumps, and wherein the mold compound fills in a space between the chip and the substrate and extrudes through the openings and extends from the second surface, wherein the mold compound extruding through the openings serves to support the package to a controlled height during said reflowing of the solder balls; and
further comprising mounting the package to a support structure by reflowing the plurality of solder balls, wherein the mold compound extruded through the openings serves to support the package to a controlled height during said reflowing of the solder balls.

8. The method of claim 7, further comprising venting any trapped gases from the package through at least one vent in the substrate.

9. The method of claim 7, further comprising affixing a plurality of solder balls on the second surface of the substrate.

10. The method of claim 7, wherein the plurality of openings are disposed along a midline of the substrate.

11. The method of claim 7, wherein the support structure comprises molded buttons.

12. The method of claim 7, wherein the support structure comprises a molded rib.

13. A device having a flip chip integrated package and a support structure, comprising:
a substrate having a first and a second surface and a plurality of openings extending from said first to said second surfaces positioned along a midline and at least one vent positioned exterior to and in line with the openings along the midline;
a chip including a plurality of conductive solder bumps for electrical connectivity with said substrate, said chip mounted on said first surface of said substrate over said openings;
a plurality of solder balls on said second surface of said substrate; and
a mold compound encapsulating said chip and adhering to said first surface of said substrate but not extending to side surfaces of said substrate, said chip supported entirely on said substrate by said conductive solder bumps, wherein said mold compound further fills in space between the chip and the first surface of the substrate and extends through said openings to create molded buttons projecting from said second surface of said substrate which act as a support structure, wherein said solder balls in a pre-reflow state project a distance from said second surface of said substrate greater than said molded buttons such that said molded buttons serve to support the package at a controlled height during a solder ball reflow.

14. A device having a flip chip integrated package and a support structure, comprising:
a substrate having a first and a second surface and a plurality of openings extending from said first to said second surfaces positioned along a midline and at least one vent positioned exterior to and in line with the openings along the midline;
a chip including a plurality of conductive solder bumps for electrical connectivity with said substrate, mounted on said first surface of said substrate over said openings;
a plurality of solder balls on said second surface of said substrate; and
a mold compound encapsulating said chip and adhering to said first surface of said substrate but not extending to side surfaces of said substrate, said chip supported entirely on said substrate by said conductive solder bumps, wherein said mold compound further fills in space between the chip and the first surface of the substrate and extends through said openings to create a molded rib which acts as a support structure, wherein said solder balls in a pre-reflow state project a distance from said second surface of said substrate greater than said molded rib such that said molded rib serves to support the package at a controlled height during solder ball reflow.

15. A method of forming a device having a flip chip integrated package and a support structure, comprising:
mounting a chip including a plurality of conductive solder bumps for electrical connectivity with a substrate on said substrate, the substrate having a first and a second surface and a plurality of openings extending from the first to the second surfaces positioned along a midline and at least one vent positioned exterior to and in line with the openings along the midline;
encapsulating the chip with a mold compound, wherein said mold compound adheres to said first surface of said substrate, said chip supported entirely on said substrate by said conductive solder bumps, and wherein the mold compound fills in a space between the chip and the substrate and extrudes through the openings and extends from the second surface, wherein the mold compound extruding through the openings serves to support the package to a controlled height during said reflowing of the solder balls, said at least one vents permitting gas to outflow during said encapsulating; and
further comprising mounting the package to a support structure by reflowing the plurality of solder balls, wherein the mold compound extruding through the openings serves to support the package to a controlled height during said reflowing of the solder balls.

16. The method of claim 15, wherein the support structure comprises molded buttons.

17. The method of claim 15, wherein the support structure comprises a molded rib.

* * * * *